US006643596B2

(12) United States Patent
Firth et al.

(10) Patent No.: US 6,643,596 B2
(45) Date of Patent: Nov. 4, 2003

(54) SYSTEM AND METHOD FOR CONTROLLING CRITICAL DIMENSION IN A SEMICONDUCTOR MANUFACTURING PROCESS

(75) Inventors: Stacy K. Firth, Austin, TX (US); W. Jarrett Campbell, Austin, TX (US)

(73) Assignee: Yield Dynamics, Inc., Santa Clara, CA (US)

( * ) Notice: Subject to any disclaimer, the term of this patent is extended or adjusted under 35 U.S.C. 154(b) by 36 days.

(21) Appl. No.: 10/017,070

(22) Filed: Dec. 13, 2001

(65) Prior Publication Data

US 2003/0115005 A1 Jun. 19, 2003

(51) Int. Cl.[7] ............................................... G06F 19/00
(52) U.S. Cl. ............................ 702/84; 702/95; 700/109
(58) Field of Search ............................... 702/84, 81–82, 702/95, 150, 155, 182; 700/109, 110, 120, 121; 355/77, 53–55; 250/252.1, 310

(56) References Cited

U.S. PATENT DOCUMENTS 6,304,999 B1 * 10/2001 Toprac et al. .................. 716/4
6,368,884 B1 *  4/2002 Goodwin et al. ............. 438/14
6,493,063 B1 * 12/2002 Seltmann et al. ............ 355/53
6,535,774 B1 *  3/2003 Bode et al. .................. 700/109

OTHER PUBLICATIONS

Gerold, Dave, Rob Hershey, Karen McBrayer, John Strutevant, "Run to Run Control Benefits to Photolithography" AEC/APC Symposium IX, Sematech, Sep. 1997.
Robertson, Eric, Stephen George, Jim Hold, "Advanced CD Control Architecture and Implementation in Motorola," AEC/APC Symposium IX, Sematech, Sep. 1997.
Jakatdar, N., X. Niu, J. Musacchio, J. Boa, C. Spanos, "DUV Lithography Control," AEC/APC Symposium X, Sematech, Oct. 1998.
Stuber, John D., Francois Pagette, Susan Tang, Device Dependent Run–to–Run Control Transistor Critical Dimension By Manipulating Photolithography Exposure Setting. AEC/APC Symposium XII. 2000.

* cited by examiner

Primary Examiner—Bryan Bui
(74) Attorney, Agent, or Firm—Gray Cary Ware & Freinrich LLP

(57) ABSTRACT

A system and method for controlling critical dimension in a semiconductor manufacturing process. The system 10 controls critical dimension by altering focus and exposure settings, based on a single measured attribute (i.e., critical dimension) and on a process model equation. The system 10 further systematically varies focus and exposure settings (e.g., by introducing variable deviation values), in order to provide unique and stable solutions for parameters within the process model equation.

22 Claims, 3 Drawing Sheets

SYSTEM AND METHOD FOR CONTROLLING CRITICAL DIMENSION IN A SEMICONDUCTOR MANUFACTURING PROCESS

FIELD OF THE INVENTION

The present invention generally relates to a system and method for controlling critical dimension in a semiconductor manufacturing process and more particularly, to a system and method which independently adjusts focus and exposure settings in a semiconductor photolithography process, in order to control critical dimension.

BACKGROUND OF THE INVENTION

Semiconductors are made in production facilities, commonly referred to as "fabs." A large fab may contain hundreds of automated tools that cooperatively work to convert circular silicon "wafers" (each consisting of dozens, hundreds, and even potentially thousands of chips) into functioning products. One of the challenges in these fabs is to control manufacturing equipment and tools, such as photolithography machines, in a manner which optimizes the features of manufactured chips and minimizes variation and defects.

One of the important features to be optimized and controlled in a semiconductor manufacturing process is "critical dimension." Critical dimension may be defined as the width of a line (or a space between lines) patterned onto a wafer surface through photolithography. Critical dimension determines the size of the smallest geometric features that can be formed during the manufacture of a semiconductor device or circuit. The ability to improve the performance of semiconductor devices is highly dependent on the size of the devices, and therefore, on critical dimension. Furthermore, as the semiconductor industry drives toward smaller critical dimensions to produce faster devices, the allowable variance in critical dimension diminishes. Thus, successful control of critical dimension is crucial in semiconductor fabrication.

Some of the present systems and methods for controlling critical dimension utilize exposure energy, or dose, as a manipulated variable to affect changes in critical dimension. These techniques attempt to compensate for the effects of focus drifts on critical dimension by adjusting the exposure dose in the photolithography process. Particularly, these techniques often use a simple linear model in the control algorithm that relates exposure dose and critical dimension. For example, the following linear "process model" may be employed by these prior control algorithms:

$$CD_k = aE_k + c_k \qquad \text{Equation (1)}$$

where $CD_k$ is the critical dimension at run k, a is a predetermined parameter, $E_k$ is the exposure dose at run k, and $c_k$ is an intercept term. The foregoing model is typically updated during the semiconductor manufacturing process by use of a simple bias or intercept adjustment. The model ascribes all variation in critical dimension to either changes in exposure or an unknown disturbance captured by the intercept term $c_k$. While this model provides some degree of control over critical dimension, its effectiveness is limited, as it does not account for other parameters which have an effect on critical dimension.

For example, it is well known that, in addition to exposure, the focus of a photolithography tool or process also has a significant effect on critical dimension. The simultaneous effects of exposure and focus on critical dimension may be illustrated by use of conventional Bossung plots, an example of which is illustrated in FIG. 1. Particularly, these plots illustrate that there may exist numerous combinations of focus and exposure that result in the same critical dimension value. In fact, this property of photolithography is a key principle behind the known process of tool qualification, which utilizes a focus-exposure matrix. In order to create such a matrix, a test wafer is subjected to multiple combinations of focus and exposure and the resultant critical dimension values are recorded in a Bossung plot. A fabrication engineer may then use the resulting plot to choose the optimal focus and exposure settings for the photolithography process.

In view of these principles, some efforts have been made to provide systems and methods that control critical dimension by adjusting both focus and exposure settings. However, these systems and methods have all required the measurement of one or more attributes in addition to critical dimension (i.e., a second measurement) in order to make the necessary focus and exposure adjustments. Most existing metrology tools provide only a single measured attribute, i.e., critical dimension. As a result, prior art systems and methods, which require an additional measured attribute, cannot independently control both focus and exposure simultaneously using most existing metrology tools and traditional run-to-run control techniques (e.g., exponentially weighted moving average techniques). Instead, these prior art systems and methods require additional tools and modifications to simultaneously adjust focus and exposure, and are therefore inefficient and cost prohibitive.

It is therefore desirable to provide a system and method for controlling critical dimension in a semiconductor manufacturing process, which overcomes the drawbacks and limitations of prior systems and methods, which adjusts focus and exposure to control critical dimension, and which requires only a single measured attribute, such as critical dimension, to perform these adjustments.

SUMMARY OF THE INVENTION

The present invention provides many advantages over conventional system and methods for controlling critical dimension. By way of example and without limitation, the present invention accurately controls critical dimension in a semiconductor photolithography process by use of a strategy that adjusts both focus and exposure settings. Furthermore, the present invention does not require the use of any measurements other than critical dimension to adjust focus and exposure settings, and to control critical dimension in a semiconductor photolithography process. Therefore, the present invention can be implemented with existing metrology tools.

The present invention updates multiple process model parameters simultaneously in an adaptive control strategy, and systematically varies the process inputs (e.g., focus and exposure settings) from run-to-run in a manner that prevents the parameter estimates from becoming singular. Particularly, the present invention forces certain conditions upon the inputs, such as pseudorandom deviations, in order to obtain unique and stable parameter estimates.

According to one aspect of the present invention, a control system is provided for a semiconductor photolithography process. The control system is adapted to control critical dimension by adjusting focus and exposure settings within the photolithography process by use of a single measured attribute.

According to a second aspect of the present invention, a run-to-run control system for controlling critical dimension in a photolithography process is provided. The control system includes a photolithography tool for performing the photolithography process; a control law portion; and an observer portion. The control law portion is communicatively coupled to the photolithography tool, and is adapted to determine focus and exposure settings based upon a process model equation, and to further communicate the focus and exposure settings to the photolithography tool for controlling the photolithography process. The observer portion is communicatively coupled to the control law portion, and is adapted to determine a plurality of parameter values for the process model equation based upon at least one prior measured critical dimension value, and to communicate the plurality of parameter values to the control law portion.

According to a third aspect of the present invention, a method is provided for controlling an output attribute in a semiconductor fabrication process. The method includes the steps of: measuring the output attribute; controlling the output attribute by simultaneously adjusting a plurality of inputs to the semiconductor fabrication process, based upon the measured output attribute and a process model equation including a plurality of parameters; estimating updates for the plurality of parameters; and systematically varying the plurality of inputs in a manner that ensures stable estimates for the plurality of parameters.

According to a fourth aspect of the present invention, a method is provided for controlling critical dimension in a photolithography process. The method includes the steps of: monitoring a single measured attribute; and controlling critical dimension by selectively adjusting focus and exposure in the photolithography process based upon the single measured attribute.

According to a fifth aspect of the present invention, a method is provided for controlling critical dimension in a semiconductor photolithography process. The method includes the steps of: determining a focus setting by use of a best focus value and a variable deviation value; determining an exposure setting by use of a control law equation; running the photolithography process with the focus and exposure settings; obtaining a resulting critical dimension measurement; and utilizing the critical dimension measurement to update a plurality of parameters used within the control law equation.

These and other features and advantages of the invention will become apparent by reference to the following specification and by reference to the following drawings.

DETAILED DESCRIPTION OF A PREFERRED EMBODIMENT OF THE INVENTION

The present invention provides a system and method for controlling critical dimension in a semiconductor manufacturing process. The invention simultaneously adjusts focus and exposure settings in order to control critical dimension in a photolithography process, based upon a single measurement attribute, such as critical dimension, and a process model equation. The invention also systematically varies focus and exposure settings to ensure unique solutions for process model parameters. In the preferred embodiment, the present invention comprises and/or resides within a run-to-run control system that controls the overall operation of a semiconductor photolithography system. Particularly, the invention may be implemented within and/or form a portion of the software and/or hardware which forms the photolithography system.

While the following discussion involves the control of critical dimension by adjusting focus and exposure settings, it should be appreciated that the system and method of the present invention can be used to control other attributes within a semiconductor fabrication process. More particularly, the teachings of the present invention may be used to control any desired output attribute in a semiconductor fabrication process (e.g., critical dimension) by adjusting and systematically varying multiple inputs or settings (e.g., focus and exposure settings), which affect the process and output attribute. Additionally, the present invention determines adjustments for these multiple inputs using measurements of a single output attribute (e.g., measurements of critical dimension).

Figure 1:
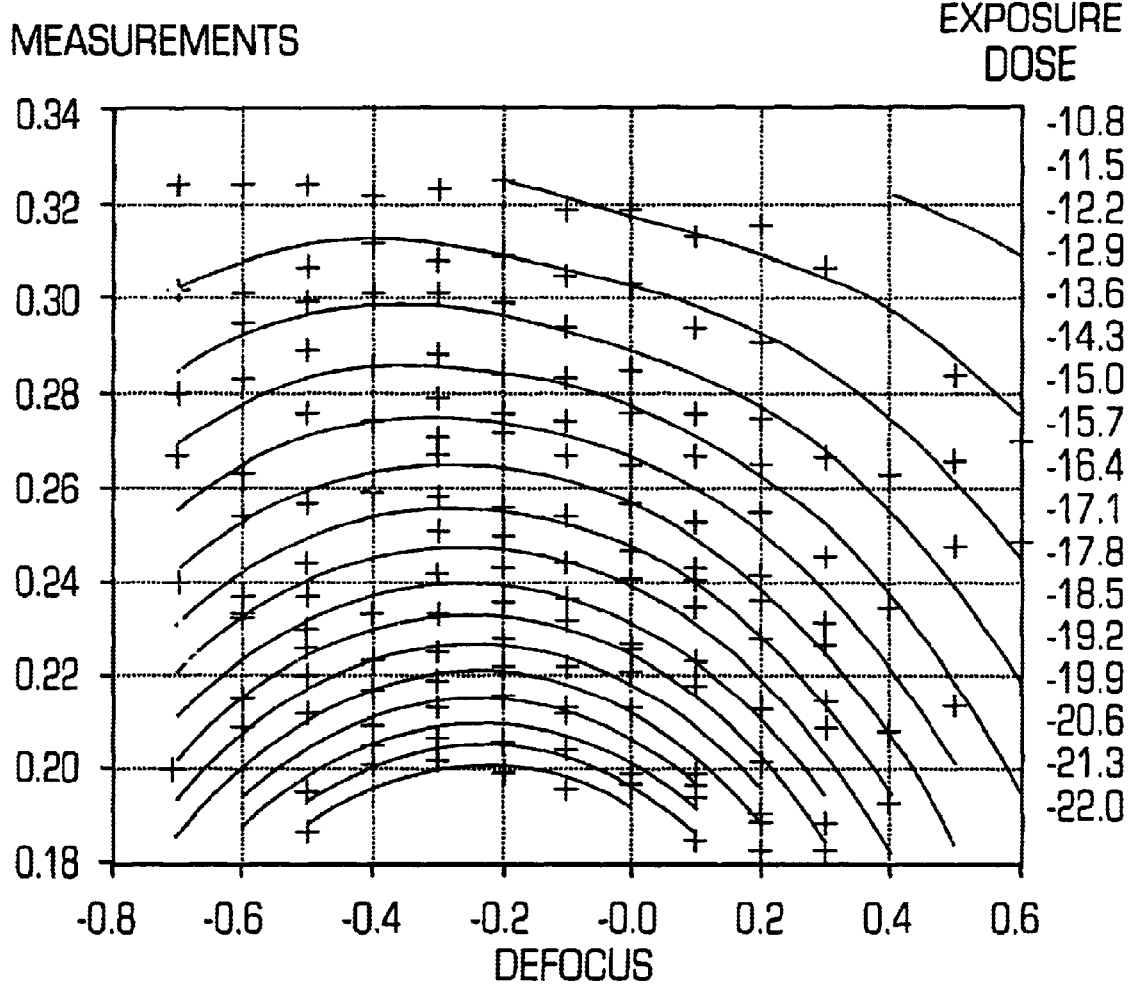
FIG. 1 is a Bossung plot illustrating the simultaneous effects of exposure and focus on critical dimension.
Figure 2:
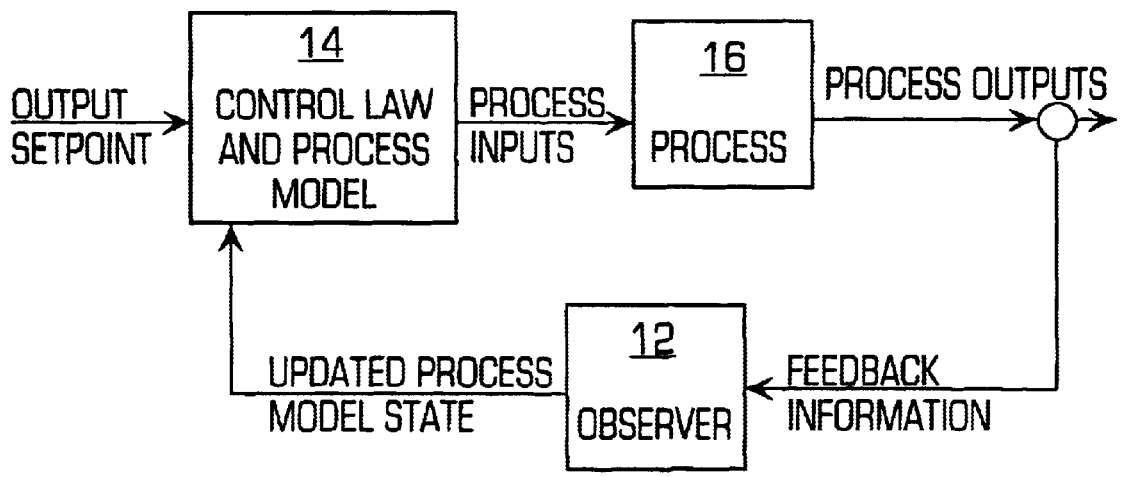
FIG. 2 is a block diagram illustrating a semiconductor fabrication control system in accordance with a preferred embodiment of the present invention.

Referring now to FIG. 2, there is shown a control system 10 in accordance with a preferred embodiment of the present invention. As should be appreciated by one of ordinary skill in the art, control system 10 is a run-to-run control system. Control system 10 may represent one or more conventional and commercially available controllers, computers, manufacturing execution systems, or independent microprocessor-based systems built specifically for use with the present invention.

As described more fully and completely below, the observer portion or module 12 may comprise one or more conventional hardware and/or software components that are adapted to estimate the actual state of the fabrication process (e.g., the photolithography process) from process outputs, and to generate updated process state information (e.g., updated parameters for use within the process model equation). The observer portion 12 then communicates this information to a control law portion 14. The control law portion 14 comprises one or more conventional hardware and/or software components that are adapted to utilize the information from observer portion 12 to determine how the fabrication process or "recipe" should be modified in order to keep the process on target (e.g., to control one or more output attributes of the process or fabricated devices). The control law portion 14 may implement one or more equations (see e.g., Equations (3), (4) below) that incorporate and/or are derived from the "process model" of the control system (see e.g., Equation (2) below), which relates measurable inputs and states to desired product qualities or attributes, such as critical dimension. Particularly, the process model is incorporated within the control law to determine which recipe parameters or process inputs (e.g., focus and exposure) should be adjusted to provide the desired output attribute value (e.g., critical dimension value).

In the preferred embodiment, the system 10 is used to control critical dimension in a semiconductor photolithography process, and the process model used within portion 14 is represented by the following equation:

$$CD_k = \frac{a_k}{E_k} + b_k F_k^2 + c_k F_k + d_k \qquad \text{Equation (2)}$$

where $CD_k$ is the critical dimension at run k, $E_k$ is the exposure setting at run k, $F_k$ is the focus setting at run k, and $a_k$, $b_k$, $c_k$, and $d_k$ are adjustable process model parameters. As should be appreciated by one of ordinary skill in the art, the process model of Equation (2) considers and compensates for the fact that critical dimension is affected by both focus and exposure. Also, critical dimension is shown to be inversely proportional to exposure, instead of being directly proportional as in the prior art process model of Equation (1). Critical dimension is further shown to be proportional to both focus and focus-squared in the process model of Equation (2). As discussed more fully and completely below, the observer portion 12 adjusts each parameter, $a_k$, $b_k$, $c_k$, and $d_k$, using a recursive least squares estimation technique. The multiple parameter adjustment allows for greater flexibility in fitting the model to the actual process. Furthermore, as should be appreciated by one of ordinary skill in the art, tracking the parameter trends over time may reveal drifts or changes in the photolithography tool or process.

The output from the control law portion 14 (i.e., the process inputs or the focus and exposure settings) is communicated to the fabrication process 16 (e.g., to the photolithography tools performing the photolithography process). The fabrication process 16 is then modified in accordance with the information or process inputs received from portion 14.

The modified process 16 provides process outputs in the form of fabricated or processed products or devices having certain measurable attributes, such as critical dimension. The data is measured or obtained from the fabricated or processed products, such as the critical dimension of the products, and is utilized as feedback information that is communicated to the observer portion 12, which uses the information to adjust settings (e.g., focus and exposure settings), in order to control the critical dimension of the products.

Figure 3:
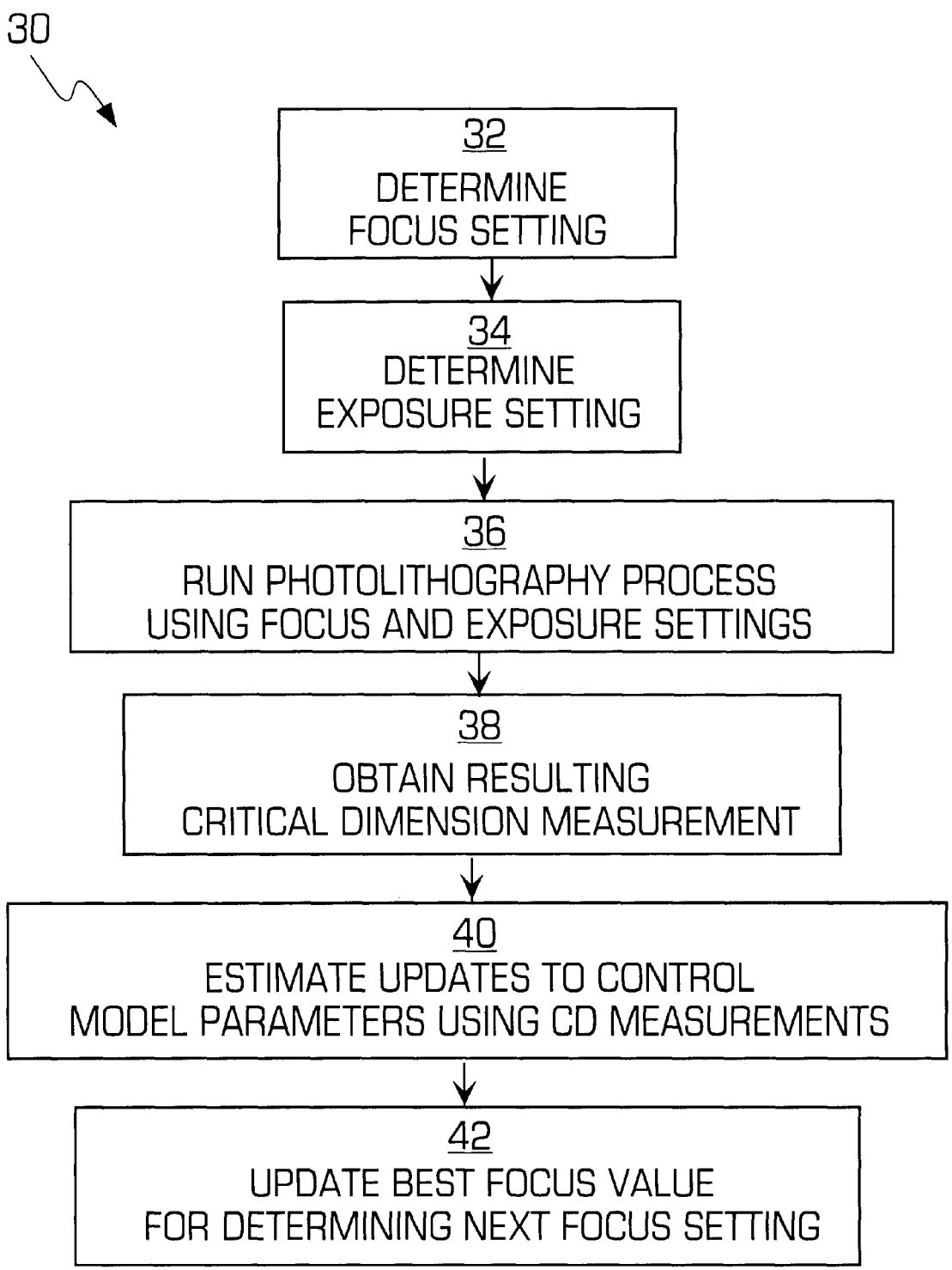
FIG. 3 is a block diagram illustrating the methodology employed by the preferred embodiment of the invention.

To better understand the operation of the preferred embodiment of the invention, reference is now made to FIG. 3, which illustrates a block diagram 30 demonstrating the functionality, method or strategy used by the control system 10 to control critical dimension within the photolithography process. The method 30 is briefly executed as follows: the control system 10 determines the focus setting to be used for the photolithography tool and/or process for the current batch in functional block or step 32; determines the exposure setting to be used for the photolithography tool and/or process for the current batch in functional block or step 34; runs the photolithography tool and/or process using the determined focus and exposure settings in functional block or step 36; obtains a measurement of critical dimension for the resulting products in functional block or step 38; estimates updates to the process model parameters based on critical dimension measurements in functional block or step 40; and updates a best focus value for determining the next focus setting in functional block or step 42. The function and/or operation of each of the foregoing steps is discussed more fully and completely below.

In functional block or step 32, the control system 10 determines the value of the focus setting that will be used for the current batch or run in the fabrication process (i.e., batch or run k). In the preferred embodiment, portion 14 of the control system 10 determines this focus setting by use of a previously calculated "best focus" value, $F_{o,k}$, and a variable deviation. In one non-limiting embodiment, the following equation is used to determine the focus setting:

$$F_k = F_{o,k} + dF_k \qquad \text{Equation (3)}$$

where $F_k$ is the focus setting at run k, and the focus deviation, $dF_k$, cycles through five values ranging between $-2\Delta F$ and $+2\Delta F$ with increments of $\Delta F$. During the first run or batch, the control system may initially set the best focus value (i.e., $F_{o,1}$) to a predetermined value that may be based upon prior knowledge of tool settings, the attributes of the wafers/chips being manufactured, trial and error, and/or any other suitable information. The best focus value will subsequently be updated in the manner described below in step 42. In the preferred embodiment, the deviation, $dF_k$, cycles through values $-2\Delta F$, $-1\Delta F$, 0, $+1\Delta F$ and $+2\Delta F$ in a pseudorandom order. The value of $\Delta F$ and the number of cycles may vary based upon the application. As may be appreciated by one of ordinary skill in the art, the foregoing values may be chosen such that the condition number of the inverted matrix in Equation (5) below (i.e., $(X^T Q^T QX)^{-1}$) remains relatively low (e.g., less than $1 \times 10^5$), thereby ensuring that the calculated model parameters remain stable and unbiased. It should further be appreciated that the deviation value $dF_k$ causes the focus settings to be systematically varied in a manner that preserves stability within the system 10 (e.g., in a manner that allows for unique and stable process model parameter estimates).

In functional block or step 34, the control system 10 determines the exposure setting to be used for the current batch or run in the fabrication process (i.e., batch or run k). In the preferred embodiment, portion 14 of the control system determines the exposure setting by use of a control law equation, which is derived from the process model. Particularly, portion 14 of the system 10 may determine the exposure setting, $E_k$, by use of the following control law equation:

$$E_k = \frac{a_k}{(T + dCD_k) - b_k F_k^2 - c_k F_k - d_k} \qquad \text{Equation (4)}$$

where T is target value for critical dimension, $F_k$ is the previously calculated focus setting, and $dCD_k$ is a critical dimension deviation value that cycles between $-\Delta CD$, 0, and $+\Delta CD$ in a with increments of $\Delta CD$. In the preferred embodiment, the deviation, $dCD_k$, cycles through values $-\Delta CD$, 0, and $+\Delta CD$ in a pseudorandom order. The value of $\Delta CD$ may be selected based upon prior knowledge of tool settings, the attributes of the wafers/chips being manufactured, trial and error, and/or any other suitable information. It should be appreciated that the deviation value $dCD_k$ causes the exposure settings to be systematically varied in a manner that preserves stability within the system 10 (e.g., in a manner that allows for unique and stable parameter estimates). For the first run in the photolithography process, the parameters $a_k$, $b_k$, $c_k$, and $d_k$ may be initialized to predetermined values based upon prior knowledge of the photolithography process and tools that are being implemented, the attributes of the wafers/chips being manufactured, trial and error, and/or any other suitable information. For subsequent runs, the process model parameters (e.g., $a_{k+1}$, $b_{k+1}$, $c_{k+1}$, and $d_{k+1}$) are calculated in the manner described below. Once an exposure setting is determined, the control system 10 proceeds to step 36.

In functional block or step 36, the control system 10 communicates the computed focus setting $F_k$ and exposure setting $E_k$ to the photolithography process and/or tool, which processes a lot of wafers (e.g., run or batch k) by use of the commanded settings. In functional block or step 38, the control system 10 obtains numeric data representing measurements of critical dimension from the lot of wafers after the processing operation is complete. In the preferred embodiment, the critical dimension measurements are obtained by use of conventional metrology tools adapted to provide such measurements. In alternate embodiments, this data may be obtained and communicated to observer portion 12 by sensors, testing devices, the manufacturing execution system or in any other suitable manner. In other alternate embodiments, measurements of other output attributes may be obtained such as wafer thickness measurements, heights and widths of resident wafer structures, electrical properties of resident wafer elements, and any other relevant parametric data.

In functional block or step 40, observer portion 12 utilizes several prior, measured critical dimension values and corresponding focus and exposure settings to estimate the value of the parameters of the process model equation for the next run, i.e., $a_{k+1}$, $b_{k+1}$, $c_{k+1}$, and $d_{k+1}$. In the preferred embodiment, the observer portion 12 uses the five most recent focus and exposure settings and the resulting measured critical dimension values, to estimate updates to the process model parameters $a_{k+1}$, $b_{k+1}$, $c_{k+1}$, and $d_{k+1}$, using a weighted least squares estimation procedure. Particularly, the least squares estimation results in the following equation that is used to determine parameter updates:

$$\theta = (X^T Q^T Q X)^{-1} X^T Q^T Q B \quad \text{Equation (5)}$$

where the matrix Q is defined by $$Q = \begin{bmatrix} Q_1 & Q_2 \\ Q_3 & Q_4 \end{bmatrix}. \quad \text{Equation (6)}$$

In Equation (7), $Q_1$ is a 5×5 matrix and $Q_4$ is a 4×4 matrix as shown below:

$$Q_1 = \begin{bmatrix} \lambda & 0 & \cdots & 0 \\ 0 & \lambda^2 & & \vdots \\ \vdots & & \ddots & 0 \\ 0 & \cdots & 0 & \lambda^q \end{bmatrix}, \quad \text{Equation (7)}$$

$$Q_4 = \begin{bmatrix} (1-\lambda) & 0 & \cdots & 0 \\ 0 & (1-\lambda) & & \vdots \\ \vdots & & \ddots & 0 \\ 0 & \cdots & 0 & (1-\lambda) \end{bmatrix}$$

where $\lambda$ is an adjustable tuning parameter, and $Q_2$ and $Q_3$ are matrices of zeros with sizes 5×4 and 4×5, respectively. The other matrices in Equation (5) are defined as follows:

$$X = \begin{bmatrix} 1/E_k & F_k^2 & F_k & 1 \\ 1/E_{k-1} & F_{k-1}^2 & F_{k-1} & 1 \\ \vdots & \vdots & \vdots & \vdots \\ 1/E_{k-4} & F_{k-4}^2 & F_{k-4} & 1 \end{bmatrix}, \quad \text{Equation (8)}$$

-continued $$B = \begin{bmatrix} CD_k \\ CD_{k-1} \\ \vdots \\ CD_{k-4} \end{bmatrix}, \quad \theta = \begin{bmatrix} a_{k+1} \\ b_{k+1} \\ c_{k+1} \\ d_{k+1} \end{bmatrix} 7.$$

By solving the foregoing equations in a known manner, the observer portion 12 obtains values for the process model parameters $a_{k+1}$, $b_{k+1}$, $c_{k+1}$, and $d_{k+1}$. These values are communicated to the control law portion 14, which uses the values to calculate the focus and exposure settings for the next batch or run.

In functional block or step 42, control system 10 updates the best focus value, (i.e., $F_{o,k+1}$), by finding the focus that is the "maximizer" of Equation (2), in a known manner. In the preferred embodiment, the best focus value is defined by the following equation:

$$F_{o,k+1} = -\frac{c_{k+1}}{2 b_{k+1}}. \quad \text{Equation (9)}$$

The method 30 may then be repeated for each subsequent run of the process, beginning with step 32.

The control system 10 of the present invention provides significant advantages over conventional systems and methods for controlling critical dimension. The system 10 controls critical dimension by simultaneously altering focus and exposure settings, based on a single measured attribute, i.e., critical dimension. As a result, the present invention can be implemented with most existing metrology tools. Also, by further systematically varying focus and exposure settings (e.g., by introducing variable deviation values), the system 10 provides unique and stable solutions for process model parameters (i.e., parameters $a_{k+1}$, $b_{k+1}$, $c_{k+1}$, $d_{k+1}$).

Figure 4:
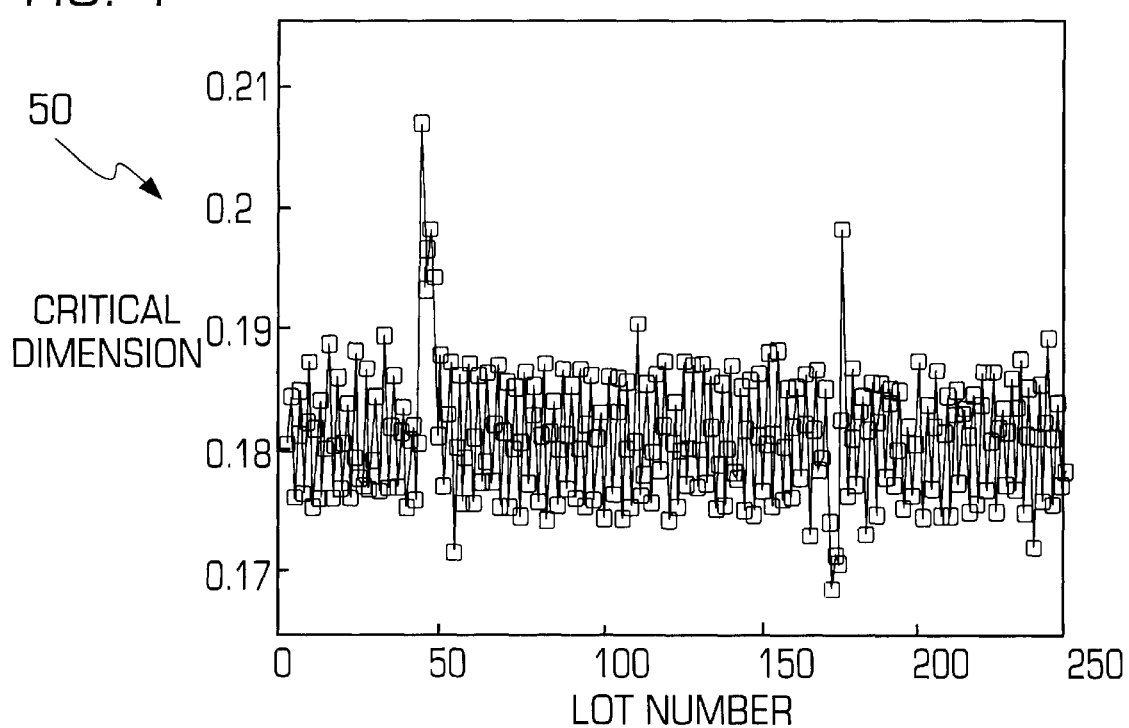
FIG. 4 illustrates several graphs of data taken during a simulation of the present invention, and showing critical dimension and parameter values generated for multiple lots of wafers.
Figure 4:
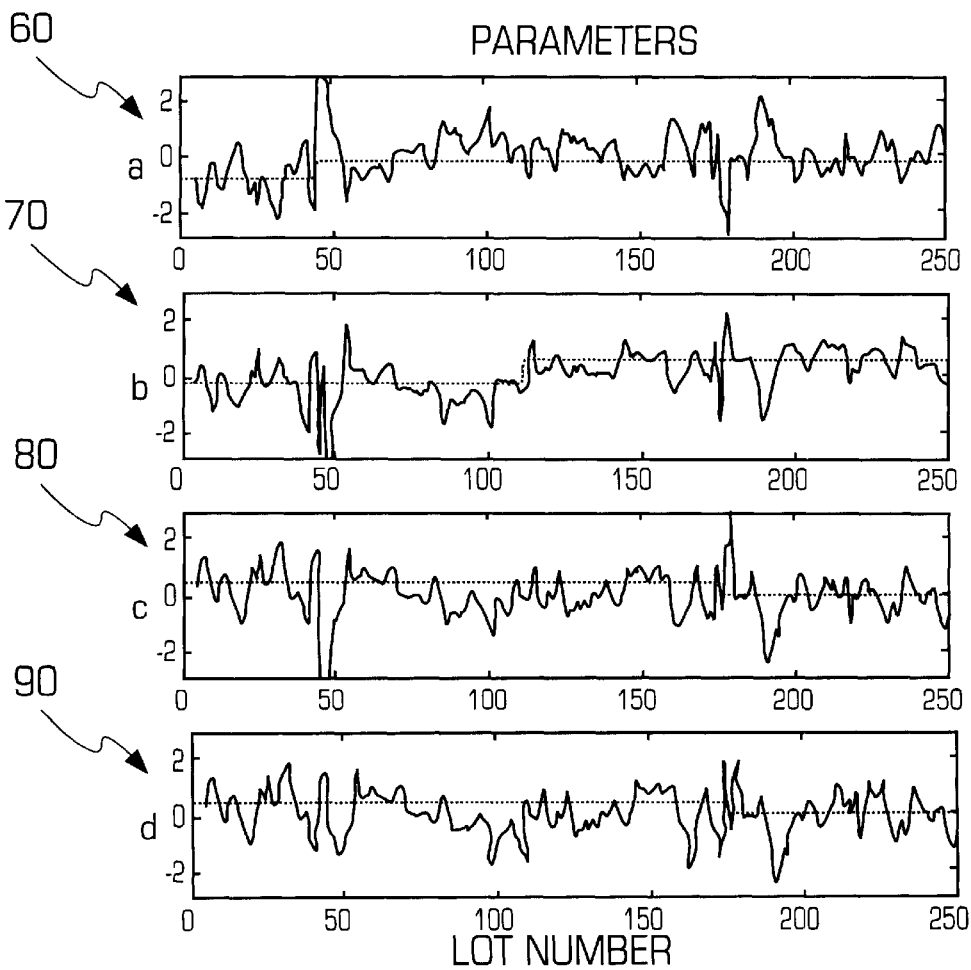

The foregoing control system 10 was simulated over multiple lots of wafers. The results of the simulation are illustrated in graphs 50–90 of FIG. 4. As illustrated in graph 50, the resulting critical dimension values vary slightly around a target value from lot to lot, but consistently fall within a desirable range. Furthermore, as illustrated by graphs 60–90, the systematic variance introduced into the system provides for unique and stable parameter estimations (e.g., the estimations of parameters a, b, c and d), and prevents the parameter estimations from becoming singular.

It should be understood that the inventions described herein are provided by way of example only and that numerous changes, alterations, modifications, and substitutions may be made without departing from the spirit and scope of the inventions as delineated within the following claims.

What is claimed is:

1. A control system for a semiconductor photolithography process, said control system being adapted to control critical dimension by adjusting focus and exposure settings within said photolithography process based upon a single measured attribute, critical dimension, and by use of the following process model equation:

$$CD_k = \frac{a_k}{E_k} + b_k F_k^2 + c_k F_k + d_k$$

where $CD_k$ is critical dimension at run k, $E_k$ is the exposure setting at run k, $F_k$ is the focus setting at run k, and $a_k$, $b_k$, $c_k$, and $d_k$ are adjustable parameters, and where the control system updates one or more of the adjustable parameters by use of a least squares estimation procedure.

2. The control system of claim 1 wherein said control system is adapted to update said adjustable parameters based upon a plurality of prior measured critical dimension values and corresponding focus and exposure settings.

3. The control system of claim 1 wherein said control system determines said focus setting by use of a best focus value plus a variable deviation value.

4. The control system of claim 3 wherein said variable deviation value cycles through a plurality of predetermined values in a pseudorandom order.

5. The control system of claim 4 wherein said variable deviation value cycles between the values of $-2\Delta F$ and $+2\Delta F$, wherein $\Delta F$ is a predetermined value.

6. The control system of claim 1 wherein said control system determines said exposure setting by use of the following equation:

$$E_k = \frac{a_k}{(T + dCD_k) - b_k F_k^2 - c_k F_k - d_k}$$

where T is a critical dimension target value and $dCD_k$ is a variable critical dimension deviation value.

7. An apparatus for controlling an output attribute in a semiconductor fabrication process, said apparatus comprising:
means for measuring said output attribute;
a first control portion which is adapted to control said output attribute by simultaneously adjusting a plurality of inputs to said semiconductor fabrication process, based upon said measured output attribute and a process model equation including a plurality of parameters; and
a second control portion which is adapted to/estimate updates for said plurality of parameters;
wherein said first control portion systematically varies said plurality of inputs in a manner that ensures stable estimates for said plurality of parameters.

8. The apparatus of claim 7 wherein said output attribute comprises critical dimension, and wherein said plurality of inputs comprises a focus setting and an exposure setting.

9. The apparatus of claim 8 wherein said focus and exposure settings are systematically varied by use of at least one deviation value that is varied in a pseudorandom manner.

10. A run-to-run control system for controlling critical dimension in a photolithography process, said control system comprising:
a photolithography tool for performing said photolithography process;
a control law portion that is communicatively coupled to said photolithography tool, said control law portion being adapted to determine focus and exposure settings based upon a process model equation, and being further adapted to communicate said focus and exposure settings to said photolithography tool for controlling said photolithography process; and
an observer portion that is communicatively coupled to said control law portion, said observer portion being adapted to estimate a plurality of parameter values for said process model equation based upon at least one prior measured critical dimension value, and to communicate said plurality of parameter values to said control law portion.

11. The control system of claim 10 wherein said process model equation is non-linear.

12. The control system of claim 11 wherein critical dimension is inversely proportional to exposure in said process model equation.

13. The control system of claim 11 wherein critical dimension is proportional to both focus and focus-squared in said process model equation.

14. The control system of claim 10 wherein said observer portion calculates said parameter values based upon a plurality of prior measured critical dimension values and corresponding focus and exposure settings.

15. The control system of claim 14 wherein said observer portion calculates said parameter values based upon five prior measured critical dimension values and corresponding focus and exposure settings.

16. A method for controlling an output attribute in a semiconductor fabrication process, said method comprising the steps of:
measuring said output attribute;
controlling said output attribute by simultaneously adjusting a plurality of inputs to said semiconductor fabrication process, based upon said measured output attribute and a process model equation including a plurality of parameters;
estimating updates for said plurality of parameters; and
systematically varying said plurality of inputs in a manner that ensures stable estimates for said plurality of parameters.

17. The method of claim 16 wherein said output attribute comprises critical dimension, and wherein said plurality of inputs comprises a focus setting and an exposure setting.

18. The method of claim 17 wherein said focus and exposure settings are systematically varied by use of at least one deviation value that is varied in a pseudorandom manner.

19. A method of controlling critical dimension in a photolithography process, said method comprising the steps of:
monitoring a single measured attribute; and
controlling critical dimension by selectively adjusting focus and exposure in said photolithography process based upon said single measured attribute, critical dimension, and by use of the following process model equation:

$$CD_k = \frac{a_k}{E_k} + b_k F_k^2 + c_k F_k + d_k$$

where $CD_k$ is critical dimension at run k, $E_k$ is the exposure setting at run k, $F_k$ is the focus setting at run k, and $a_k$, $b_k$, $c_k$, and $d_k$ are adjustable parameters.

20. A method for controlling critical dimension in a semiconductor photolithography process, comprising the steps of:
determining a focus setting by use of a best focus value and a variable deviation value;
determining an exposure setting by use of a control law equation;
running said photolithography process using said focus and exposure settings;
obtaining a resulting critical dimension measurement; and
utilizing said critical dimension measurement to update a plurality of parameters used within said control law equation;

wherein said focus setting is determined by use of the following equation:

$$F_k = F_{o,k} + dF_k$$

where $F_k$ is the focus setting at run k, $F_{o,k}$ is the best focus value, and $dF_k$ is the deviation value, which is varied in a pseudorandom manner.

21. The method of claim 20 wherein said best focus value is determined by use of the following equation:

$$F_{o,k+1} = -\frac{c_{k+1}}{2b_{k+1}}$$

where $F_{o,k+1}$ is the best focus value for run k+1, and $b_{k+1}$, $c_{k+1}$ are parameters used within said control law equation.

22. A method for controlling critical dimension in a semiconductor photolithography process, comprising the steps of:

determining a focus setting by use of a best focus value and a variable deviation value;

determining an exposure setting by use of a control law equation;

running said photolithography process using said focus and exposure settings;

obtaining a resulting critical dimension measurement; and utilizing said critical dimension measurement to update a plurality of parameters used within said control law equation;

wherein said exposure setting is determined by use of the following control law equation:

$$E_k = \frac{a_k}{(T + dCD_k) - b_k F_k^2 - c_k F_k - d_k}$$

where $E_k$ is the exposure setting at run k, T is a critical dimension target value, $F_k$ is the focus setting at run k, $a_k$, $b_k$, $c_k$, and $d_k$ are parameters used within said control law and $dCD_k$ is a deviation value, which is varied in a pseudorandom manner.

* * * * *